US008878255B2

(12) United States Patent
Wang

(10) Patent No.: US 8,878,255 B2
(45) Date of Patent: Nov. 4, 2014

(54) IMAGE SENSORS WITH MULTIPLE OUTPUT STRUCTURES

(71) Applicant: Semiconductor Components Industries, LLC, Phoenix, AZ (US)

(72) Inventor: Shen Wang, Pittsford, NY (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/735,542

(22) Filed: Jan. 7, 2013

(65) Prior Publication Data

US 2014/0191355 A1   Jul. 10, 2014

(51) Int. Cl.
*H01L 27/148* (2006.01)
*H01L 21/02* (2006.01)
*H01L 21/00* (2006.01)
*H01L 29/768* (2006.01)

(52) U.S. Cl.
CPC .... *H01L 27/14868* (2013.01); *H01L 27/14843* (2013.01); *H01L 27/14806* (2013.01); *H01L 29/76816* (2013.01); *H01L 27/14812* (2013.01); *H01L 27/14831* (2013.01)
USPC ........... 257/240; 257/215; 257/231; 257/232; 257/233; 257/241; 257/242; 438/60

(58) Field of Classification Search
CPC .................. H01L 27/14812; H01L 27/14831; H01L 27/14843; H01L 27/14806; H01L 29/76816
USPC .......... 257/215, 231–233, 239–242, E26.156, 257/E27.152, E29.231; 438/60
See application file for complete search history.

(56) References Cited

U.S. PATENT DOCUMENTS

| | | | |
|---|---|---|---|
| 4,559,550 A | 12/1985 | Koike et al. | |
| 4,575,763 A * | 3/1986 | Elabd | 348/317 |
| 4,647,977 A | 3/1987 | Tower | |
| 4,652,928 A | 3/1987 | Endo et al. | |
| 4,774,586 A | 9/1988 | Koike et al. | |
| 4,837,630 A | 6/1989 | Ueda | |
| 4,949,183 A | 8/1990 | Stevens | |
| 4,980,771 A | 12/1990 | Ueda et al. | |
| 5,060,245 A | 10/1991 | Nelson | |
| 5,182,648 A | 1/1993 | Hirota | |
| 5,189,498 A | 2/1993 | Sakakibara | |
| 5,233,429 A | 8/1993 | Jung | |
| 5,448,089 A | 9/1995 | Banghart et al. | |
| 5,517,243 A | 5/1996 | Kudo et al. | |
| 5,608,242 A | 3/1997 | Kamasz et al. | |
| 5,650,352 A | 7/1997 | Kamasz et al. | |
| 5,652,622 A | 7/1997 | Hynecek | |

(Continued)

FOREIGN PATENT DOCUMENTS

| | | |
|---|---|---|
| EP | 0601568 A1 | 6/1994 |
| EP | 0866502 A2 | 9/1998 |

(Continued)

*Primary Examiner* — Fernando L Toledo
*Assistant Examiner* — Aaron Gray
(74) *Attorney, Agent, or Firm* — Howard & Howard Attorneys PLLC

(57) ABSTRACT

In various embodiments, image sensors incorporate multiple output structures by including multiple sub-arrays, at least one of which includes a region of active pixels, a dark pixel region that is fanned and/or slanted, a dark pixel region that is unfanned and unslanted, a horizontal CCD, and an output structure for conversion of charge to voltage.

14 Claims, 10 Drawing Sheets

(56) References Cited

U.S. PATENT DOCUMENTS

| | | | |
|---|---|---|---|
| 5,705,836 A | 1/1998 | Agwani et al. | |
| 5,715,002 A | 2/1998 | Cortiula | |
| 5,828,091 A | 10/1998 | Kawai | |
| 5,856,846 A | 1/1999 | Bosiers et al. | |
| 5,990,952 A | 11/1999 | Hamasaki | |
| 5,998,815 A | 12/1999 | Hirama | |
| 6,207,982 B1 | 3/2001 | Shibata | |
| 6,252,285 B1 | 6/2001 | Furumiya et al. | |
| 6,335,757 B1 | 1/2002 | Vodanovic | |
| 6,351,001 B1 | 2/2002 | Stevens et al. | |
| 6,392,260 B1 | 5/2002 | Farrier et al. | |
| 6,417,531 B1 * | 7/2002 | Nakashiba | 257/215 |
| 6,489,992 B2 | 12/2002 | Savoye | |
| 6,657,178 B2 | 12/2003 | Aebi | |
| 6,985,182 B1 * | 1/2006 | Morinaka et al. | 348/311 |
| 7,027,093 B2 | 4/2006 | Miyahara | |
| 7,157,754 B2 | 1/2007 | Nagasaki et al. | |
| 7,277,128 B2 * | 10/2007 | Miyahara | 348/249 |
| 7,414,655 B2 | 8/2008 | Meisenzahl et al. | |
| 7,847,361 B2 | 12/2010 | Kokusenya | |
| 8,102,455 B2 | 1/2012 | Parks | |
| 8,199,238 B2 | 6/2012 | Parks et al. | |
| 2008/0018768 A1 | 1/2008 | Tanaka | |
| 2010/0157126 A1 | 6/2010 | Compton et al. | |
| 2010/0261158 A1 | 10/2010 | Nordman et al. | |
| 2012/0147240 A1 | 6/2012 | Parks | |

FOREIGN PATENT DOCUMENTS

| | | |
|---|---|---|
| EP | 1137255 A2 | 9/2001 |
| EP | 1152469 A2 | 11/2001 |
| EP | 1244149 A2 | 9/2002 |
| EP | 1755166 A2 | 2/2007 |
| JP | 60213057 A | 10/1985 |
| JP | 63019976 U | 2/1988 |
| JP | 2008192813 A | 8/2008 |
| WO | WO-9912001 A1 | 3/1999 |

* cited by examiner

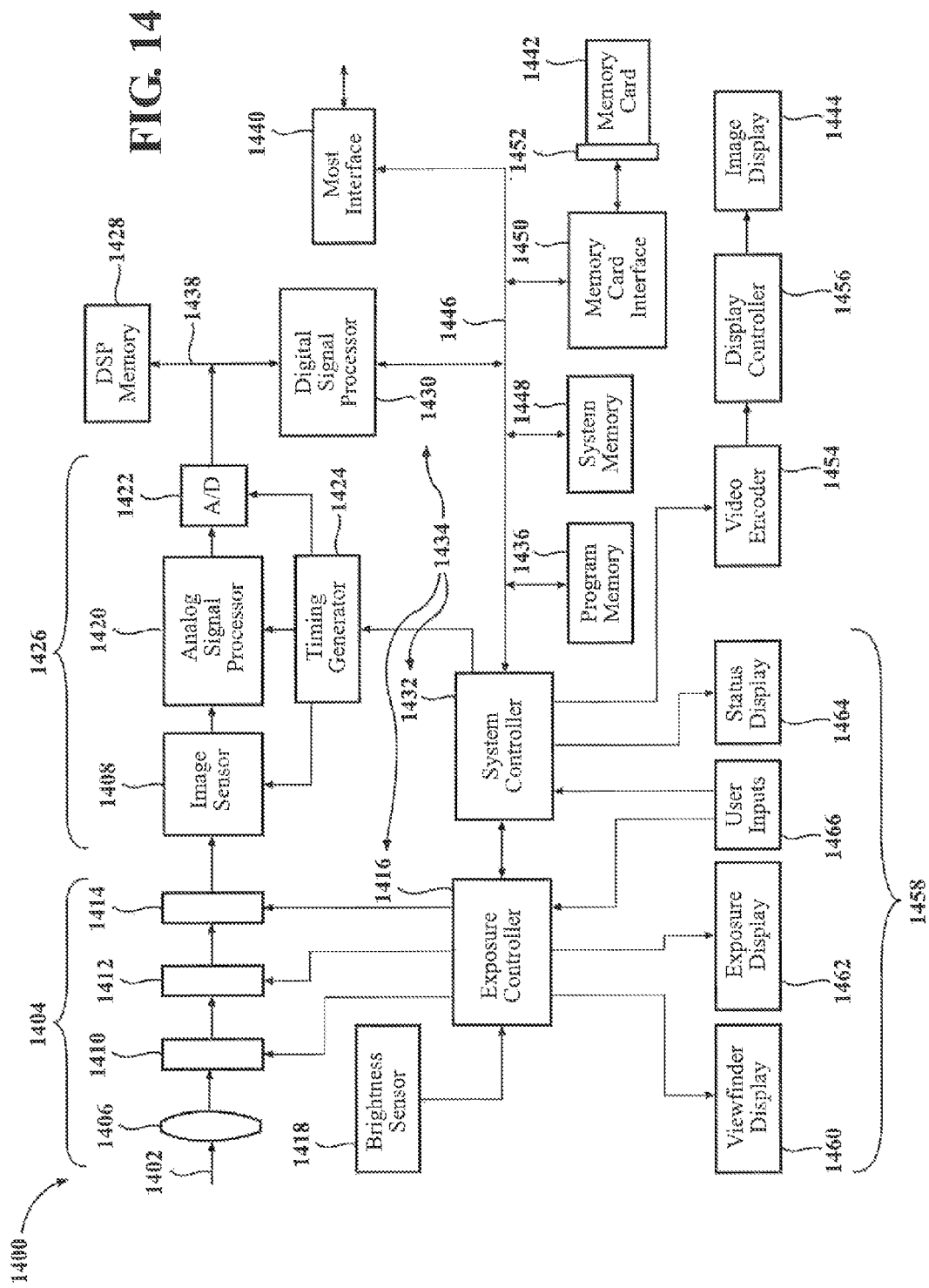

IMAGE SENSORS WITH MULTIPLE OUTPUT STRUCTURES

TECHNICAL FIELD

The present invention relates, in various embodiments, to the construction, fabrication, and use of charge-coupled-device (CCD) image sensors.

BACKGROUND

CCD image sensors typically include an array of photosensitive areas that collect charge carriers in response to illumination. The collected charge is subsequently transferred from the array and converted to a voltage from which an image may be reconstructed by associated circuitry. FIG. 1A depicts a conventional interline CCD image sensor 10 that contains an array of photodiodes 11 arranged in columns. A vertical CCD (VCCD) 12 is disposed next to each column of photodiodes 11, and the VCCDs 12 are connected to a horizontal CCD (HCCD) 13. Each photodiode 11 along with a "vertical channel," i.e., its corresponding portion of VCCD 12, constitutes a "pixel" of the image sensor 10. Following an exposure period, charge is transferred from the photodiodes 11 into the VCCDs 12, which subsequently shift the charge, row-by-row in parallel, into the HCCD. The HCCD then transfers the charge serially to output circuitry 14 that includes, e.g., a floating diffusion sense node and an output buffer amplifier. The charge from the HCCD is converted, pixel-by-pixel, into voltage at the output circuitry 14, and the signal is then transferred to additional circuitry (either on-chip or off-chip) for reconstruction into an image.

Over time, CCD image sensors have grown larger (i.e., incorporated more pixels) and have been utilized in a host of applications, some of which demand high frame rates, e.g., machine vision applications and video display. While innovative CCD image sensor designs incorporating, e.g., multiple output circuits, have enabled higher frame rates, such designs often cannot provide performance increases commensurate with growing sensor sizes. Furthermore, many CCD image sensors having multiple output circuits utilize HCCDs having individual shift registers of different sizes, which can increase complexity and compromise the charge capacity of the HCCD. Thus, there is a continuing need for CCD image sensors having multiple outputs, with their concomitant increase in frame rate, as well as straightforward, easily fabricated layouts that do not deleteriously impact charge-handling capacity.

SUMMARY

Embodiments of the present invention improve the frame rate of CCD image sensors by incorporating multiple outputs from which light-induced charge (i.e., "photocharge") may be read out of the image-capturing pixel array of active pixels. In accordance with preferred embodiments of the present invention, active pixels each contain a photosensitive region (PSR) that converts incident light into photocharge, as well as a vertical channel for transfer of the photocharge through the array and eventually to an output. (The vertical channels of the pixels in the array may collectively be referred to as a VCCD.) In various embodiments, the image sensor is effectively divided into sub-arrays that each contain a subset of the imaging pixels as well as one or more outputs (including, e.g., an HCCD and one or more amplifiers for conversion of charge into voltage signals). In order to provide multiple different output paths for photocharge without complex and convoluted charge read-out paths, each sub-array utilizes a linear HCCD (in which charge flows parallel to only one direction, rather than, e.g., turning corners and being routed in different directions) that is electrically connected to a group of dark pixels, i.e., pixels shielded from incident light (e.g., by an opaque layer disposed thereover). In preferred embodiments, one region (i.e., a contiguous grouping) of dark pixels, electrically connected to the active pixels of the imaging array at the border between the region of dark pixels and the active pixels, is fanned (i.e., compressed in a lateral direction such that the width of the pixels decreases along the length of the region) and/or slanted (i.e., directed in a direction not parallel to the direction of charge transfer within the active pixel array and from the active pixel array to the dark pixels) such that one or more HCCDs and accompanying output structures may be placed between the dark-pixel regions of two adjoining sub-arrays. Preferably the fanned and/or slanted region of dark pixels is electrically connected to a region of dark pixels that is not fanned or slanted, and thus has (i) a substantially constant pixel width and (ii) a charge-transfer direction substantially parallel to that within the active pixel array and/or substantially perpendicular to the charge-transfer direction within the HCCDs.

In order to enhance charge-transfer efficiency within the dark-pixel regions, embodiments of the invention utilize dark pixels that lack the PSR present in the otherwise similar active pixels (as detailed herein, dark pixels also feature one or more opaque covering layers to block incoming light and prevent spurious charge generation). Thus, the width of the vertical channel within the dark pixels may be kept constant even in regions of dark pixels in which the pixel width is decreasing.

In an aspect, embodiments of the invention feature an image sensor including or consisting essentially of two or more pixel sub-arrays that each comprises at least one output structure for conversion of charge to voltage. At least one of the sub-arrays includes or consists essentially of a region of active pixels, a fanned region of dark pixels electrically connected to the region of active pixels, an unfanned region of dark pixels electrically connected to the fanned region, an HCCD electrically connected to the unfanned region, and an output structure for conversion of charge to voltage electrically connected to the HCCD. Each active pixel includes or consists essentially of (i) a PSR for converting light into electrical charge and (ii) a vertical channel for transfer of charge from the PSR. Each dark pixel in the fanned region includes or consists essentially of a vertical channel for transferring charge and is shielded from incident light. Each dark pixel in the unfanned region includes or consists essentially of a vertical channel for transferring charge and is shielded from incident light. The width of the dark pixels in the fanned region decreases along a direction extending from the array of active pixels to the unfanned region. The width of the dark pixels in the unfanned region is substantially constant along a direction extending from the fanned region to the HCCD.

Embodiments of the invention may include one or more of the following in any of a variety of combinations. One or more (e.g., all) of the dark pixels in the fanned region may include a PSR, and/or one or more (e.g., all) of the dark pixels in the unfanned region may include a PSR. The width of the vertical channel within dark pixels of the fanned region may be substantially equal to the width of the vertical channel within dark pixels of the unfanned region. One or more (e.g., all) of the dark pixels in the fanned region may lack a PSR, and/or one or more (e.g., all) of the dark pixels in the unfanned region may lack a PSR. One or more of the sub-arrays may include or consist essentially of (a) a region of active pixels each including or consisting essentially of (i) a PSR and (ii) a vertical channel for transferring charge from the PSR, (b) electrically connected to the region of active pixels, an unfanned region of dark pixels each (i) comprising a vertical channel for transferring charge and (ii) shielded from incident light, (c) electrically connected to the unfanned region of dark pixels, an HCCD, and (d) electrically connected to the HCCD, an output structure for conversion of charge to voltage. The width of the dark pixels in the unfanned region may be substantially equal to the width of the active pixels in the region of active pixels.

The output structure of one sub-array may be disposed within a gap between two sub-arrays resulting from the pixel-width decrease within a fanned region of dark pixels within at least one of the two sub-arrays. The output structures of two adjoining sub-arrays may both be disposed within a gap between the two sub-arrays resulting from the pixel-width decrease within a fanned region of dark pixels within at least one of the two sub-arrays. The output structure of at least one of the sub-arrays may include or consist essentially of (i) a dummy shift register having a width substantially equal to the width of shift registers in the HCCD, (ii) a charge-carrying region having a width, along at least a portion of its length, smaller than the width of shift registers in the HCCD, (iii) a sense node, and (iv) an amplifier for conversion of charge into a voltage signal. The charge-carrying region may include or consist essentially of a tapered region having a width (e.g., in a direction substantially perpendicular to the direction of charge flow therethrough) that decreases along at least a portion of its length. A plurality of control gate electrodes may extend across fanned regions of dark pixels of at least two sub-arrays. The direction of charge transfer in the vertical channels of the active pixels may be (i) substantially parallel to the direction of charge transfer in the vertical channels of the dark pixels of the unfanned region and/or (ii) substantially perpendicular to the direction of charge transfer in the HCCD. The HCCD may include or consist essentially of a plurality of shift registers having substantially equal dimensions in the direction of charge transfer within the HCCD.

In another aspect, embodiments of the invention feature an image sensor including or consisting essentially of two or more pixel sub-arrays that each comprises at least one output structure for conversion of charge to voltage. At least one of the sub-arrays includes or consists essentially of a region of active pixels, a slanted region of dark pixels electrically connected to the region of active pixels, an unslanted region of dark pixels electrically connected to the slanted region, an HCCD electrically connected to the unslanted region, and an output structure for conversion of charge to voltage electrically connected to the HCCD. Each active pixel includes or consists essentially of (i) a PSR for converting light into electrical charge and (ii) a vertical channel for transfer of charge from the PSR. Each dark pixel in the slanted region includes or consists essentially of a vertical channel for transferring charge and is shielded from incident light. Each dark pixel in the unslanted region includes or consists essentially of a vertical channel for transferring charge and is shielded from incident light. The direction of charge transfer in the vertical channels within the dark pixels of the slanted region is not parallel to the direction of charge transfer in the vertical channels within the active pixels. The direction of charge transfer in the vertical channels within the dark pixels of the unslanted region is substantially parallel to the direction of charge transfer in the vertical channels within the active pixels.

Embodiments of the invention may include one or more of the following in any of a variety of combinations. The direction of charge transfer in the vertical channels within dark pixels of the slanted region of a first sub-array may be different from the direction of charge transfer in the vertical channels within dark pixels of the slanted region of a second sub-array different from the first sub-array. The first sub-array may adjoin the second sub-array. In at least one sub-array, the width of dark pixels in the slanted region may be (i) approximately equal to the width of dark pixels in the unslanted region and/or (ii) approximately equal to the width of active pixels in the region of active pixels. One or more (e.g., all) of the dark pixels in the slanted region may include a PSR, and/or one or more (e.g., all) of the dark pixels in the unslanted region may include a PSR. The width of the vertical channel within dark pixels of the slanted region may be substantially equal to the width of the vertical channel within dark pixels of the unslanted region. One or more (e.g., all) of the dark pixels in the slanted region may lack a PSR, and/or one or more (e.g., all) of the dark pixels in the unslanted region may lack a PSR. One or more of the sub-arrays may include or consist essentially of (a) a region of active pixels each comprising (i) a PSR and (ii) a vertical channel for transferring charge from the PSR, (b) electrically connected to the region of active pixels, an unslanted region of dark pixels each (i) comprising a vertical channel for transferring charge and (ii) shielded from incident light, (c) electrically connected to the unslanted region of dark pixels, an HCCD, and (d) electrically connected to the HCCD, an output structure for conversion of charge to voltage. The direction of charge transfer in the vertical channels within the dark pixels of the unslanted region may be substantially parallel to the direction of charge transfer in the vertical channels within the active pixels.

The output structure of one sub-array may be disposed within a gap between two sub-arrays formed by a slanted region of dark pixels within at least one of the two sub-arrays. The output structures of two adjoining sub-arrays may both be disposed within a gap between the two sub-arrays formed by a slanted region of dark pixels within at least one of the two sub-arrays. The output structure of at least one of the sub-arrays may include or consist essentially of (i) a dummy shift register having a width substantially equal to the width of shift registers in the HCCD, (ii) a charge-carrying region having a width, along at least a portion of its length, smaller than the width of shift registers in the HCCD, (iii) a sense node, and (iv) an amplifier for conversion of charge into a voltage signal. The charge-carrying region may include or consist essentially of a tapered region having a width (e.g., in a direction substantially perpendicular to the direction of charge flow therethrough) that decreases along at least a portion of its length. A plurality of control gate electrodes may extend across slanted regions of dark pixels of at least two sub-arrays. The HCCD may include or consist essentially of a plurality of shift registers having substantially equal dimensions in a direction of charge transfer within the HCCD.

In yet another aspect, embodiments of the invention feature an image sensor including or consisting essentially of an array of active pixels, an array of dark pixels electrically connected to the array of active pixels, an HCCD electrically connected to the array of dark pixels, and an output structure for conversion of charge to voltage electrically connected to the HCCD. Each of the active pixels includes or consists essentially of (i) a PSR for converting light into electrical charge and (ii) a vertical channel for transferring charge from the PSR. Each of the dark pixels (i) includes a vertical channel for transferring charge, (ii) is shielded from incident light, and (iii) lacks a PSR.

Embodiments of the invention may include one or more of the following in any of a variety of combinations. The width of the vertical channel within one or more (e.g., all) of the dark pixels may be greater than the width of the vertical channel within the active pixels. The direction of charge transfer within the array of dark pixels may not be parallel to a direction of charge transfer within the array of active pixels. The output structure may include or consist essentially of a sense node and an amplifier for conversion of charge into a voltage signal. The output structure may include or consist essentially of (i) a dummy shift register having a width substantially equal to a width of shift registers in the HCCD, (ii) a charge-carrying region having a width, along at least a portion of its length, smaller than the width of shift registers in the HCCD, (iii) a sense node, and (iv) an amplifier for conversion of charge into a voltage signal. The charge-carrying region may include or consist essentially of a tapered region having a width (e.g., in a direction substantially perpendicular to the direction of charge flow therethrough) that decreases along at least a portion of its length. The array of active pixels, the array of dark pixels, the HCCD, and the output structure may be disposed within one pixel sub-array of the image sensor, and the image sensor may include one or more additional pixel sub-arrays different from the pixel sub-array.

The array of dark pixels may include or consist essentially of a fanned region of dark pixels electrically connected to the array of active pixels, and an unfanned region of dark pixels electrically connected to the fanned region. The HCCD may be electrically connected to the unfanned region of dark pixels, the width of the dark pixels in the fanned region may decrease along the direction extending from the array of active pixels to the unfanned region, and/or the width of the dark pixels in the unfanned region may be substantially constant along the direction extending from the fanned region to the HCCD.

The array of dark pixels may include or consist essentially of a slanted region of dark pixels electrically connected to the array of active pixels, and an unslanted region of dark pixels electrically connected to the slanted region. The HCCD may be electrically connected to the unslanted region of dark pixels, the direction of charge transfer in the vertical channels within the dark pixels of the slanted region may not be parallel to the direction of charge transfer in the vertical channels within the active pixels, and the direction of charge transfer in the vertical channels within the dark pixels of the unslanted region may be substantially parallel to the direction of charge transfer in the vertical channels within the active pixels.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean ±10%, and in some embodiments, ±5%. The term "consists essentially of" means excluding other materials that contribute to function, unless otherwise defined herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 14 is a block diagram of an image capture device incorporating a CCD image sensor in accordance with various embodiments of the invention.

DETAILED DESCRIPTION

Figure 1A:
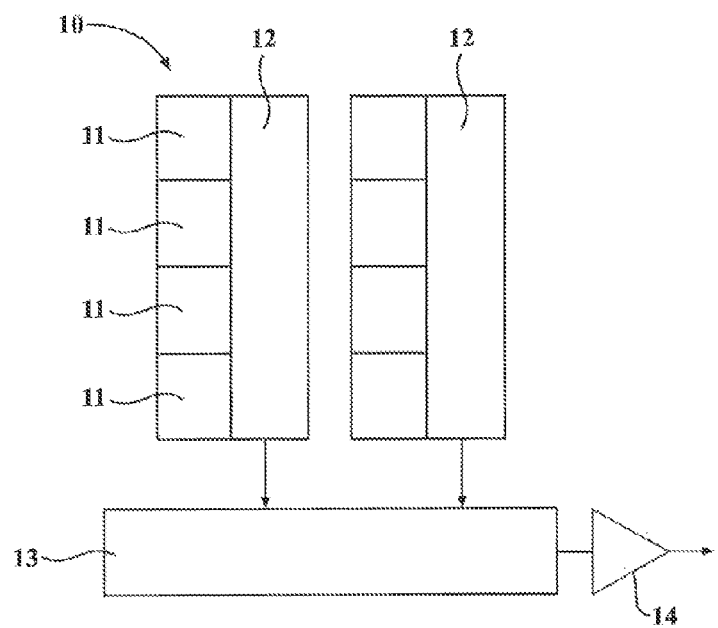
FIG. 1A is a block diagram of a conventional CCD image sensor.
Figure 1B:
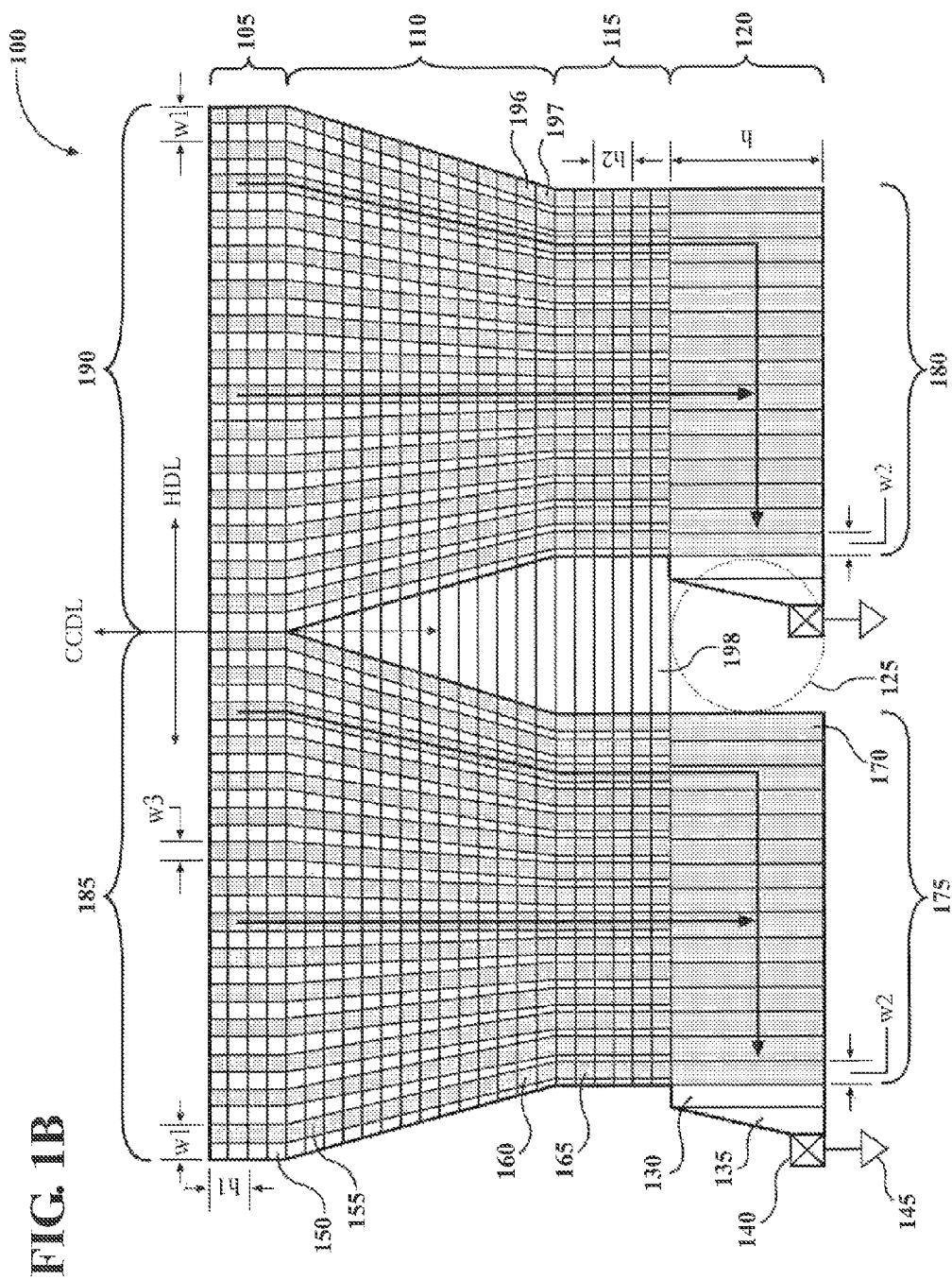
FIG. 1B is a schematic diagram of portions of two sub-arrays of a CCD image sensor incorporating fanned regions of dark pixels in accordance with various embodiments of the invention.

FIG. 1B depicts a CCD image sensor 100 in accordance with various embodiments of the present invention. As shown, image sensor 100 is preferably an interline CCD, in which each active pixel 105 incorporates both a photosensitive region (PSR, the white region in FIG. 1B) and a portion of a VCCD (or "vertical shift register," "vertical channel," or "buried channel" for charge transfer, the gray region in FIG. 1B). Exemplary PSRs include photodiodes, photodetectors, photoconductors, and/or photocapacitors. While only two rows of active pixels 105 are shown in FIG. 1B, the image sensor 100 typically includes many more active pixels 105 arranged in a grid of intersecting rows and columns (e.g., extending above the rows of active pixels 105 shown in FIG. 1B). As also shown in FIG. 1B, the image sensor 100 is arranged into two or more sub-arrays 185, 190 in order to, e.g., achieve a high frame rate while maintaining good image performance. Although only two sub-arrays are shown in FIG. 1B, various embodiments of the invention feature more than two sub-arrays.

Each sub-array 185, 190 of image sensor 100 includes, electrically connected to the active pixels 105, a fanned region 110 and an unfanned region 115 of "dark pixels," i.e., pixels that resemble active pixels but that are shielded from incident light. The PSRs of the dark pixels thus do not accumulate photo-induced charge; however, utilizing dark pixels having PSRs (and thus physically resembling active pixels) often simplifies processing and pixel layout. In some embodiments, described below with reference to FIGS. 10-13, some or all of the dark pixels each lack a PSR therein, thus eliminating PSR-related dark current that may accumulate in dark pixels featuring PSRs. Typically the dark pixels of regions 110, 115, like the vertical-channel regions of active pixels 105, are shielded from incident light, e.g., covered by an opaque material, e.g., a metal layer (not explicitly shown in FIG. 1B for clarity). Each unfanned region 115 is connected to a set of horizontal shift registers 120 (that collectively form an HCCD).

As shown, in various embodiments of the invention the active pixels 105 of image sensor 100 are arranged in columns parallel to the center column direction line (CCDL) and rows parallel to the horizontal direction line (HDL), and the area of each active pixel 150 is defined as $w_1 \times h_1$. Along each column in fanned region 110, the width of the pixels decreases such that the columns "fan in," thereby forming a pixel-free gap between the fanned regions 110 of the sub-arrays 185, 190. In various embodiments, the pixel width of the pixels in the fanned region 110 decreases from the top row of pixels 155 to the final row of pixels 160 in the fanned region 110, thus giving fanned region 110 a substantially trapezoidal shape. The pixels 160 in the last row of the fanned region 110 have a width $w_2$ smaller than the width $w_1$ of the active pixels 150. The pixels 160 connect to the pixels of the unfanned region 115, which are, like the active pixels 150, arranged substantially parallel to both the CCDL and the HDL; thus, the width of the pixels of the unfanned region is substantially constant and equal to the width $w_2$.

The horizontal shift registers 120 are electrically connected to the pixels in unfanned region 115, and thus the width of the horizontal shift registers is also equal to $w_2$. Since $w_2$ is smaller than $w_1$, and each row of active pixels 150 has the same number of pixels as each of the rows of fanned region 110 and unfanned region 115, the total width of the horizontal shift registers is less than the width of the active pixels 150 in each sub-array 185, 190, thereby forming a gap 125 within which an output structure may be disposed. In various embodiments, the output structure for each sub-array includes one or more "dummy" horizontal shift registers 130 at the end of the row of horizontal shift registers 120 to reduce electronic noise arising from signals utilized to clock charge within image sensor 100 and for layout convenience (since, as shown, each dummy register 130 may be approximately the same size and orientation as the horizontal shift registers 120). The output structure also may include a tapered transfer region 135 that enables charge transfer onto a sense node 140 (e.g., a floating diffusion). From the sense node 140, the transferred charge is converted to a voltage by an output amplifier 145, which may include or consist essentially of a single or multiple-stage amplifier. The gap 125 formed between two sets 175, 180 of horizontal shift registers has a size defined as $(w_1-w_2) \times n$ (where n is the total number of columns within each sub-array 185, 190, i.e., 30 as shown in FIG. 1B). Thus, the gap 125 may be larger when the sub-arrays have a larger number of columns.

In preferred embodiments, and as shown in FIG. 1B, the charge capacity of the vertical channel of each pixel in fanned region 110 remains substantially constant despite the pixels having increasingly smaller widths. In some embodiments, the height $h_2$ of the pixels in the fanned region 110 remains substantially constant but the width $w_3$ of the vertical channel within each of the pixels increases to compensate for the diminished width of the pixels themselves. In this manner, the total area (i.e., the charge capacity) of the vertical channel in each of the pixels remains substantially constant while the pixels in fanned region 110 have a substantially constant height. Alternatively, the width $w_3$ of the vertical channel within each of the pixels in fanned region 110 may be substantially constant while the height $h_2$ of the pixels is increased to compensate for the diminishing pixel width.

As depicted in FIG. 1B, the image sensor 100 is a two-phase image sensor. That is, the channel potential in each pixel in image sensor is controlled via application of voltage to two vertical gates 196, 197. The gates 196, 197 may extend across multiple sub-arrays, as shown in FIG. 1B, and typically include or consist essentially of a semiconductor material such as polysilicon. (Other embodiments of the invention feature three- or four-phase image sensors, as known to those of skill in the art and as illustrated below with reference to FIGS. 10 and 12.)

The extension of gates 196, 197 across multiple sub-arrays actually improves production yield in various embodiments, as multiple disconnected portions of gates 196, 197 (e.g., one for each sub-array) would likely require more complex interconnection schemes such as the use of metal bus lines. As shown in FIG. 1B, a "poly-bridge" 198 (e.g., a polysilicon layer, which may simply be an extension of the gate lines) may connect the gates of both fanned regions 110 and unfanned regions 115 across different sub-arrays 185 and 190. The tapered transfer region 135 that connects to the sense node 140, having a height that is less than the height of the horizontal shift registers 120 (at least for a portion thereof; as shown, the height of the tapered transfer region 135 may change as a function of its width), allows space above the sense node 140 for signal bus wires to route under the poly-bridge 198 without breaks therein or necessitating layout alterations therefor.

Because the columns in the unfanned region 115 are parallel to the CCDL line (and thus parallel to the horizontal shift registers 120), charge transfer from the pixels in unfanned region 115 into the horizontal shift registers will be substantially uniform (i.e., compared to a charge transfer into horizontal shift registers directly from the pixels in fanned region 110). Furthermore, the presence of unfanned region 115 facilitates design and layout of the image sensor 100.

During operation of image sensor 100, when a photon of incoming light strikes an active pixel 105 (i.e., the PSR thereof), a charge is generated. The charge is then transferred to the vertical channel (gray area in FIG. 1B) of the pixel via operation of a transfer gate (not shown). Inside the vertical channel, the charge is then transferred downwards by clocking the vertical gates 196, 197, passing through fanned region 110 and unfanned region 115 before reaching the horizontal shift registers 120. Within the horizontal shift registers 120, the charge is transferred to the left (in FIG. 1B) and passes through one or more dummy shift registers 130 and through the tapered region 135 before reaching the sense node 140, where it is converted a voltage signal by the output amplifier 145.

In FIG. 1B, the output structure for each sub-array, i.e., the dummy register 130, tapered region 135, sense node 140, and amplifier 145, is positioned on the left side of the horizontal shift registers 120 for each sub-array. However, in various embodiments of the present invention, the output structure is positioned on the right side of the horizontal shift registers 120 for one or more sub-arrays. Specifically, some gaps 125 between two sub-arrays may contain the output structures for both of the sub-arrays, rather than only the one depicted in FIG. 1B. This arrangement may be particularly useful to position output structures away from the outside edge of image sensor 100 (or a unit-cell die tiled to form the sensor) where photolithography aberrations may be more prevalent.

Figure 2:
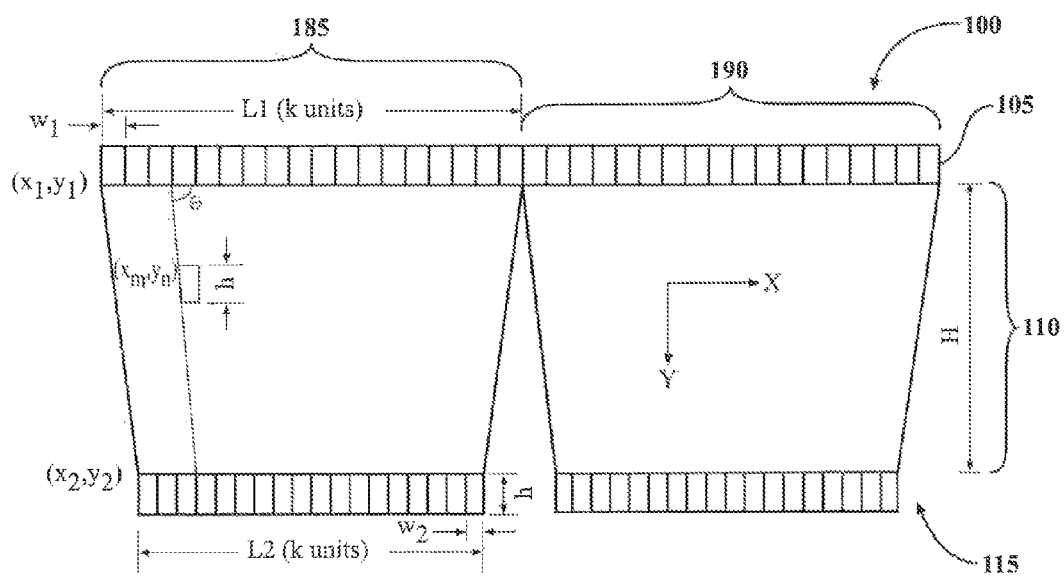
FIG. 2 is a schematic diagram of portions of the image sensor of FIG. 1B.

FIG. 2 illustrates one technique of laying out image sensor 100 in accordance with various embodiments of the present invention. FIG. 2 schematically depicts image sensor 100 and shows a single row of active pixels 105, the fanned region 110 of sub-arrays 185, 190, and the first row of unfanned region 115. As described previously, the columns of pixels in the fanned regions 110 have decreasing widths, and thus "fan down." Each sub-array 185, 190 has k columns of pixels, and the pixel width of active pixels 105 is $w_1$. The pixel width in the last fanned row in the fanned region 110 is $w_2$, and the height of the pixels in fanned region 110 is assumed to be a constant value h. The coordinates $(x_m, y_n)$ of any pixel in the fanned region 110 may be calculated based on the following equations:

$$L1 = kw_1$$

$$L2 = kw_2$$

$$\tan\theta = H/(x_2 + mw_2 - x_1 - mw_1)$$

$$y_n = y_1 + nh$$

$$x_m = x_1 + mw_1 + (y_n - y_1)/\tan\theta$$

Thus, the design and layout of the fanned regions 110 may be automated and produced via computer control rather than requiring time-consuming customized manual layout.

Figure 3:
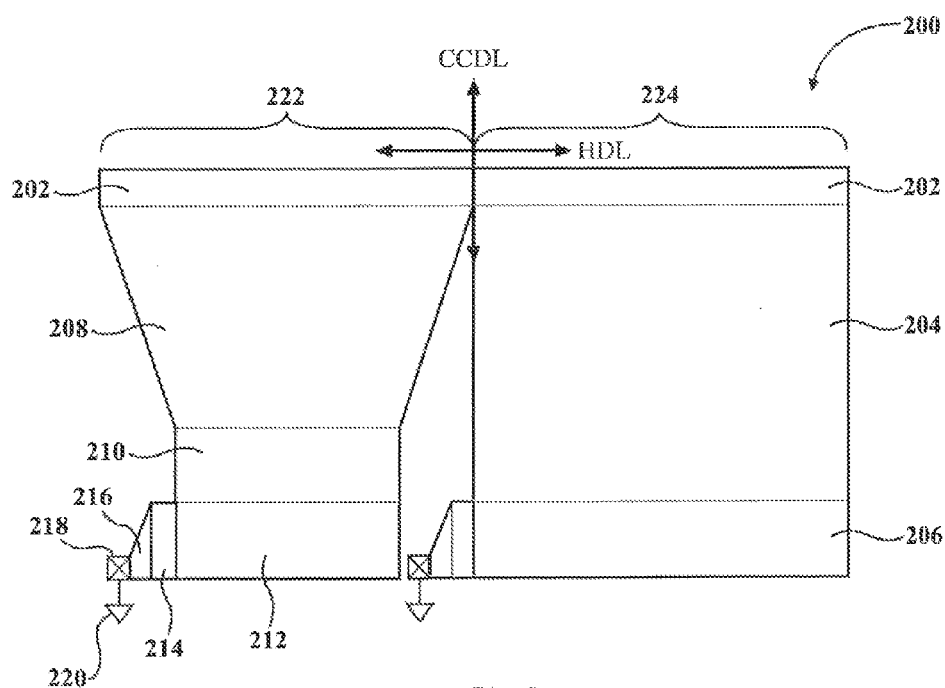
FIG. 3 is a schematic diagram of portions of two sub-arrays of a CCD image sensor, one of which incorporates a fanned region of dark pixels, in accordance with various embodiments of the invention.

FIG. 3 depicts an image sensor 200 in accordance with various other embodiments of the present invention. The image sensor 200 is shown as having two sub-arrays 222, 224, although embodiments may include more than two sub-arrays. Both sub-arrays 222, 224 include an active pixel region 202. In sub-array 224, the active pixel region 202 connects to an unfanned dark pixel region 204 in which all columns are parallel to the CCDL. That is, sub-array 224 does not contain a fanned region between the active pixels and the horizontal shift registers 206. Therefore, the pixel width in region 204 is the same as that of the active pixels in the region 202. Sub-array 222 features a fanned region 208 that connects to an unfanned region 210, and all columns in the fanned region 208 have pixels of diminishing widths (i.e., the columns fan down with respect to the CCDL). As in the sub-arrays 185, 190 in image sensor 100, the columns of pixels in fanned region 208 connect to unfanned region 210, in which the columns of pixels are disposed substantially parallel to the CCDL. The columns in unfanned region 210 are connected to horizontal shift registers 212. The width of the horizontal shift registers 212 is the same as that of the pixels in unfanned region 210 and smaller than that of the pixels in active region 202. As described above with reference to FIG. 1B, photo-induced charge propagates from the active pixels in region 202 downward and passes through fanned region 208 and unfanned region 210 and into the horizontal shift registers 212. Inside the horizontal shift registers 212, charge transfers leftward to one or more dummy shift registers 214, through a tapered-down region 216, and onto a sense node 218 (e.g., a floating diffusion). The charge is finally converted to a voltage signal by an output amplifier 220. For clarity, the control gates (see FIG. 1B) are not shown in FIG. 3. Just as in image sensor 100 of FIG. 1B, the output structures depicted in FIG. 3 may be positioned at either end of the horizontal shift registers for each sub-array. For example, the output structures for both sub-arrays 222, 224 may be positioned between sub-arrays 222, 224.

Figure 4:
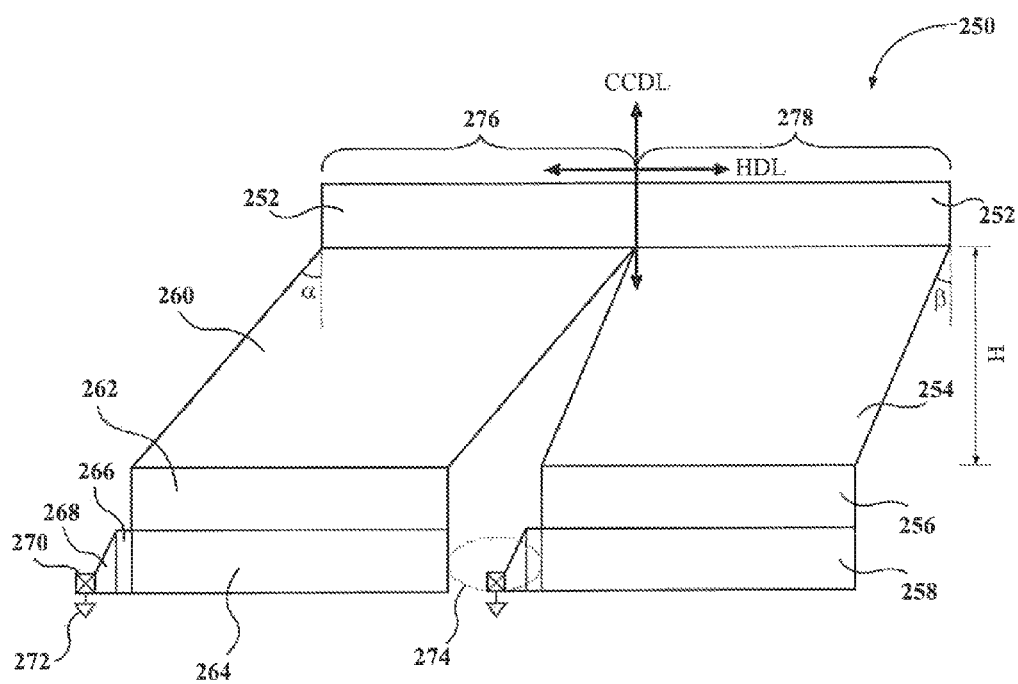
FIG. 4 is a schematic diagram of portions of two sub-arrays of a CCD image sensor incorporating slanted regions of dark pixels in accordance with various embodiments of the invention.

FIG. 4 depicts portions of an image sensor 250 in accordance with various embodiments of the present invention. As shown, the image sensor 250 contains two sub-arrays 276, 278, although embodiments of the invention contain more than two sub-arrays. Each of the sub-arrays 276, 278 includes active pixels 252 arranged in rows and columns. The columns of active pixels 252 in sub-array 276 connect to a slanted region 260 of dark pixels that slant leftward at an angle α. All the columns in slanted region 260 are parallel to each other and are slanted at the angle α relative to the CCDL. Therefore, in the illustrated embodiment, the width of the pixels in slanted region 260 does not change as a function of distance away from the active pixels 252 and instead is identical to the pixel width of pixels 252. The columns in slanted region 260 are connected to columns in an unfanned, unslanted region 262, which are parallel to the CCDL (and thus to the columns of active pixels 252). The columns in region 262 are connected to horizontal shift registers 264.

Charge generated in the region of active pixels 252 is transferred from the active pixels down through the dark pixels in slanted region 260 and into region 262. From region 262, the charge travels into the horizontal register 264. Once inside the horizontal shift register 264, the charge is transferred to one or more dummy shift registers 266, through a tapered region 268, and into a sense node 270 (e.g., a floating diffusion), which it is converted to a voltage signal by an output amplifier 272.

Sub-array 278 has a similar arrangement, but the columns of slanted region 254 are slanted by a different angle β. The dark pixels in slanted region 254 are connected to the dark pixels of an unfanned, unslanted region 256, which are parallel to the CCDL (and thus to the columns of active pixels 252). The columns in region 256 are connected to horizontal shift registers 258. The pixel width in horizontal shift registers 258 is substantially identical to the pixel width of active pixels in region 252.

Since regions 260 and 254 are slanted at different angles with respect to the CCDL, a gap 274 between the regions (and thus between shift registers 264, 258) results. The width of the gap 274 is defined as H×(tan α−tan β), where H is the total height of the fanned regions 254, 260. As described above with respect to image sensor 100, the gap 274 enables the provision of an output structure for one or more of the sub-arrays 276, 278 therewithin.

In image sensor 250, the pixels in the slanted regions 260, 254 do not decrease in width as a function of distance away from the active pixels; thus, the vertical channel width may be as wide as possible to improve the charge transfer from the active pixels 252 down and into the horizontal registers 258, 264. Moreover, the pixel height may be substantially constant from the active region through the slanted region, and the width of the individual horizontal shift registers may be substantially equal to that of the active pixels, thus improving the charge capacity of these structures. However, since the pixel height and width do not substantially change with the implementation of slanted regions 260, 254 in image sensor 250, some dark pixels and horizontal shift registers will protrude beyond the boundaries defined by the dimensions of the active area of pixels 252. (For example, portions of regions 260, 262 and shift registers 264, as well as the output structure electrically connected thereto, protrude laterally beyond the lateral extent of the active pixels 252.) In order to mitigate any photolithography aberrations (which may be more prevalent at the die edges), the output structures electrically connected to such protruding regions may be electrically connected to the inward-facing end of the horizontal shift registers in such sub-arrays.

Figure 5:
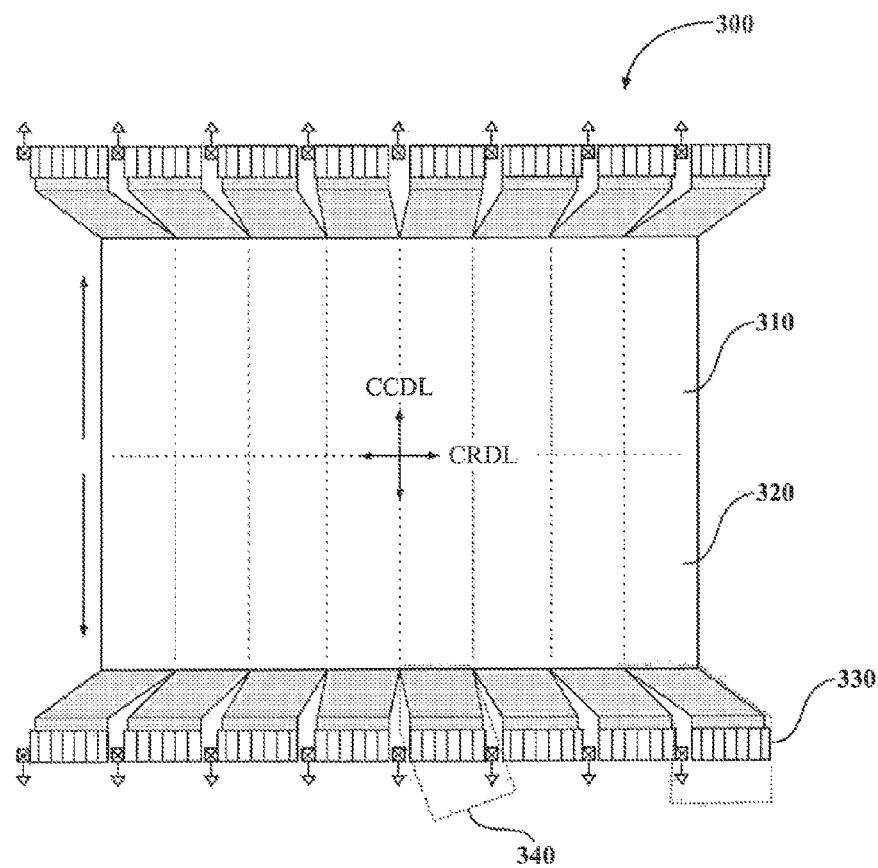
FIG. 5 is a schematic diagram of a CCD image sensor having slanted regions of dark pixels slanted at a variety of different angles in accordance with various embodiments of the invention.

FIG. 5 depicts an image sensor 300 in accordance with various embodiments of the present invention. As shown, image sensor 300 features two regions of active pixels 310, 320, each of which is separated into eight sub-arrays. As indicated by the arrows, photo-induced charge generated in region 310 is directed upward to multiple different outputs, and photo-induced charge generated in region 320 is directed downward to multiple different outputs. Each sub-array includes a slanted region of dark pixels, an unslanted, unfanned region of dark pixels, and, connected thereto, a set of horizontal shift registers and an output structure. As shown, the slanted regions of dark pixels are slanted at a variety of different angles (which tend to increase away from the center of the image sensor 300), thereby forming gaps therebetween for the placement of the output structures for each sub-array. For example, the slanting angle for sub-array portion 330 is larger than the slanting angle for sub-array portion 340. As shown, sub-arrays directly opposite each other on either side of the image sensor 300 may be slanted at substantially the same angle with respect to the CCDL. Charge may be transferred out of image sensor 300 simultaneously from 16 different outputs, thereby enabling a high frame rate.

Various embodiments of the current invention have been described above. Different variations and modifications may be implemented in light of the above teachings. For example, active pixels may be electrically connected to a region that is fanned as well as slanted (i.e., having pixel widths that decrease and that are angled away from the CCDL). Various embodiments of the invention also incorporate alternative pixel configurations for dark pixels. Specifically, some or all of the dark pixels in accordance with embodiments of the present invention lack the PSR present in the active pixels, and thereby minimize or eliminate PSR-related dark currents in the dark pixels, improving image quality and signal-to-noise ratio.

Figure 6:
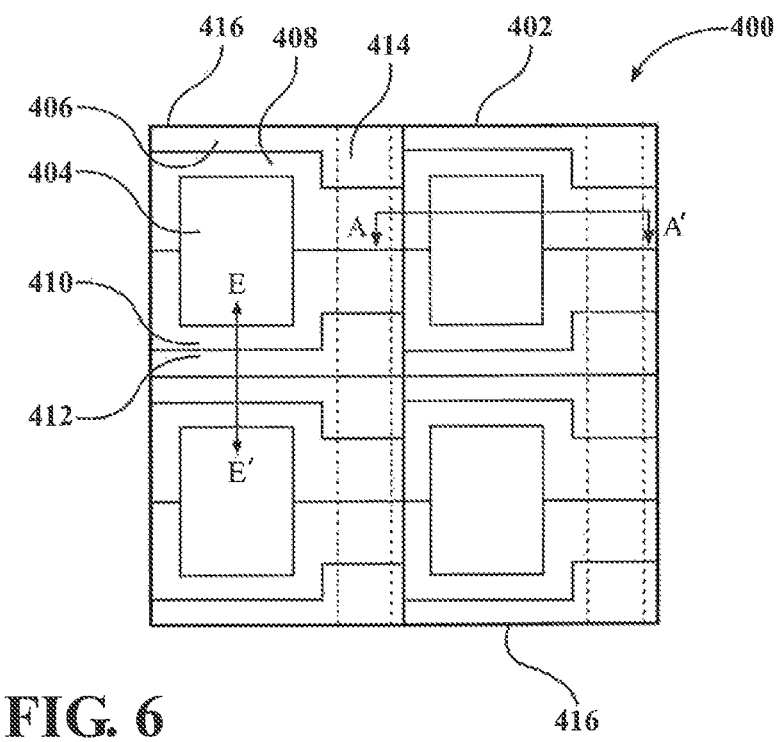
FIG. 6 is a schematic plan view of an array of dark pixels in a conventional CCD image sensor.

FIG. 6 depicts a 2×2 array 400 of dark pixels in a conventional interline CCD. A single pixel 402 includes a photodiode 404 surrounded by four vertical electrode gates 406, 408, 410 and 412. The photodiode region converts incoming photons into charge that is transferred into a vertical channel 414 (indicated by the dashed lines) via operation of the transfer gate 408. The charge is then transferred downward into a horizontal register (not shown) in line-by-line fashion via operation of the four vertical gates 406, 408, 410 and 412. Since the array 400 contains dark pixels, it is covered by an opaque material 416 to block light from entering the photodiode 404. The opaque material is typically a layer of metal such as tungsten or aluminum.

Figure 7:
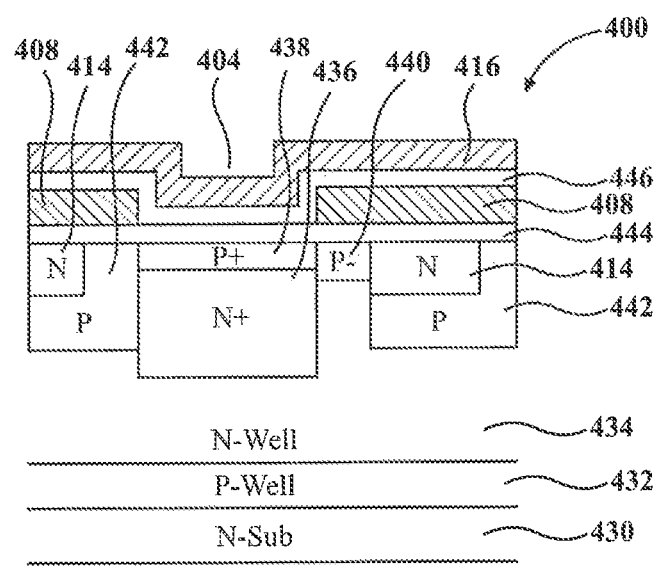
FIG. 7 is a partial cross-sectional view of the array of FIG. 6.

FIG. 7 depicts a cross-sectional view of a portion of the array shown in FIG. 6 along the line A-A'. The dark pixel 402 includes an N-type substrate 430 topped with a P-well layer 432 and an N-well layer 434. The photodiode 404 includes an N+ layer 436 and a P+ layer 438 formed in the N-well 434. Charge collected in the photodiode 436 may be transferred through a transfer gate channel 440 under the transfer gate 408 and into the vertical channel 414, which is isolated from the other n-type regions by a channel stop region 442. An insulation layer 444, which typically includes or consists essentially of an oxide layer or a combination of nitride and oxide layers, is formed over the semiconductor (e.g., silicon) surface. As shown in FIG. 6, the transfer gate 408 helps to define an opening above, and thus does not cover, the photodiode 404. The opaque material 416 covers the entire surface of the pixel 402 to block light from entering the photodiode 404. An insulation layer 446 isolates the opaque layer 416 from underlying layers. The structure of the dark pixel 402 is identical to an active pixel, other than the addition of the opaque material 416 over the dark pixel 402 that is omitted in the active pixels.

Figure 8:
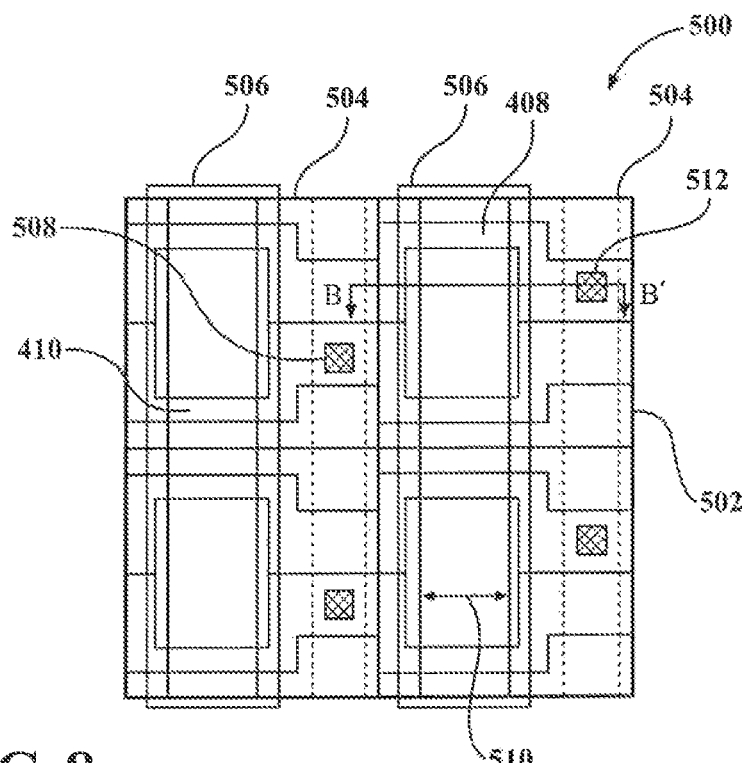
FIG. 8 is a schematic plan view of an array of dark pixels in a conventional CCD image sensor.

FIG. 8 depicts another 2×2 array 500 of dark pixels in a conventional interline CCD. The array 500 resembles array 400 except that, instead of a layer of opaque material 416 covering the entire array surface, two opaque layers 504 and 506 collectively cover the array 500. In array 500, the opaque layer 504 (which is typically a metal material such as tungsten) is not only utilized as a light shield, but also as a bus connection. That is, the opaque layer 504 on the right side of array 500 is also used to connect to the electrode gate 408 via a metal contact 512, and the opaque layer 504 on the left side of array 500 is used to connect to the electrode gate 410 via a metal contact 508. Since the gates 408 and 410 are applied by different clocks, the two layers 504 must be isolated from each other to prevent electrical shorting. A gap 510 thus formed between the layers 504 is covered by another opaque layer 506 to prevent light from entering the photodiode region. The opaque layer 506 is typically a metal material such as tungsten or aluminum.

Figure 9:
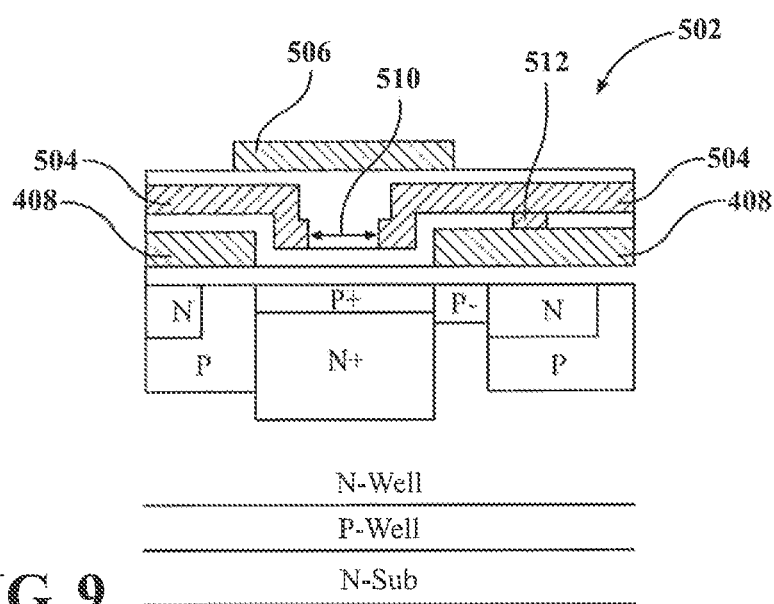
FIG. 9 is a partial cross-sectional view of the array of FIG. 8.

FIG. 9 depicts a cross-sectional view of a portion of the array shown in FIG. 8 along the line B-B'. The pixel 502 is identical to the pixel 402 of FIGS. 6 and 7 except that two opaque layers 504 and 506 are utilized to cover the photodiode opening rather than a single layer 416. As shown, the opaque layer 504 on the right side of the array 500 is used to connect to the electrode gate 408 via a metal contact 512. The gap 510 is covered by the opaque layer 506 to prevent light from entering the photodiode region.

Figure 10:
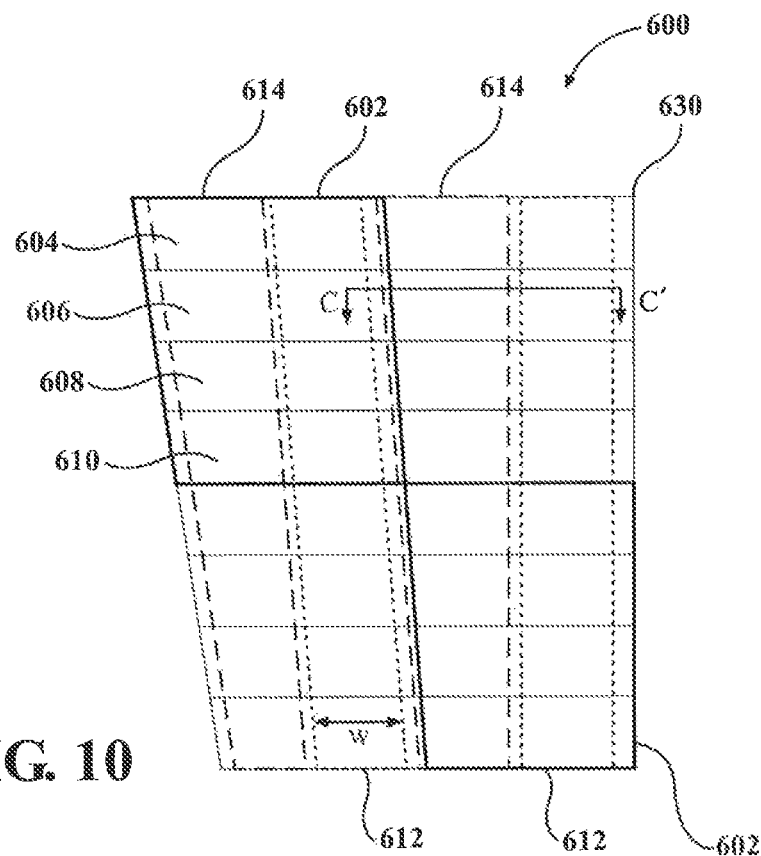
FIG. 10 is a schematic plan view of an array of dark pixels in a CCD image sensor in accordance with various embodiments of the invention.

FIG. 10 depicts a 2×2 array 600 of dark pixels in an interline CCD in accordance with embodiments of the present invention. As shown in FIG. 10, a single pixel 602 features four vertical electrode gates 604, 606, 608, and 610. Because the pixel 602 is a dark pixel, the PSR present in the active pixels of the array is omitted, thereby minimizing or eliminating PSR-related dark current generated in the pixel 602 (dark current may still be generated in a vertical channel 612). Charge in the vertical channel 612 (transferred from active pixels not shown in FIG. 10) may be transferred downward into either a region of unslanted vertical channels (as described above) or a horizontal register (not shown) in line-by-line fashion via operation of the four vertical gates 604, 606, 608, and 610. In order to isolate the channel 612 from neighboring channels, a channel stop implant 614 is included within the pixels. Since there is no PSR in the dark pixels of array 600, the vertical gates 604, 606, 608, and 610 may be formed as straight stripes across the pixels. The pixels of array 600 are covered by an opaque material 630, which typically includes or consists essentially of a metal such as tungsten or aluminum, to block light from entering the pixels and generating spurious photocharge.

Figure 11:
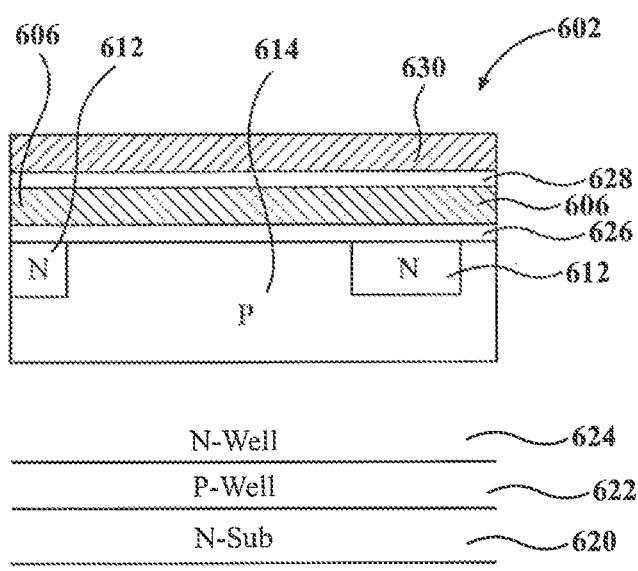
FIG. 11 is a partial cross-sectional view of the array of FIG. 10.

FIG. 11 depicts a cross-sectional view of a portion of the array shown in FIG. 10 along the line C-C'. The pixel 602 includes an N-type substrate 620 topped by a P-well layer 622 and an N-well layer 624. (In various embodiments of the present invention, the doping polarities of the various layers may be reversed.) The channel stop 614 (which is p-type in the illustrated embodiment) is formed (e.g., via ion implantation) to isolate the vertical channel 612 so that charge may be transferred within the channel 612 without leakage to neighboring channels. As shown, the channel stop 614 may effectively surround the channel 612 for isolation. An insulation layer 626 (typically an oxide layer or a combination of nitride and oxide layers) is formed over the semiconductor (e.g., silicon) surface. The electrode gate 606 is a straight stripe across the pixel, as shown in the illustrative embodiment of FIG. 10. The opaque layer 630 covers the entire surface of the pixel 602 to block incoming light. An isolation layer 628 isolates the opaque layer 630 from underlying layers.

Figure 12:
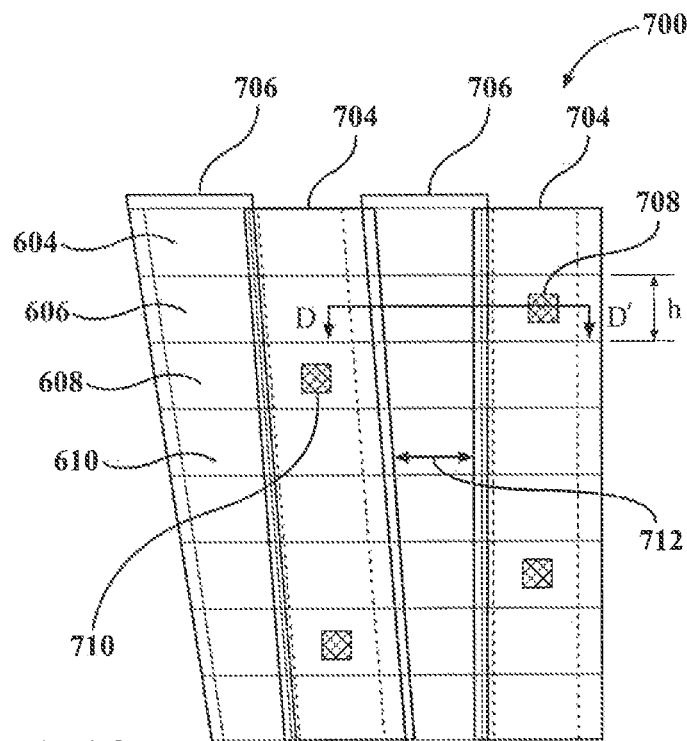
FIG. 12 is a schematic plan view of an array of dark pixels in a CCD image sensor in accordance with various embodiments of the invention.

FIG. 12 depicts another 2×2 array 700 of dark pixels in an interline CCD in accordance with embodiments of the present invention. The array 700 is similar to array 600 except that two opaque layers 704, 706 collectively cover the array (rather than the single opaque layer 630). The opaque layer 704 (which typically includes or consists essentially of a metal such as tungsten) is used not only as a light shield, but also as a bus connection. That is, the opaque layer 704 on the right side of the array 700 is also used to connect to the electrode gate 606 via a metal contact 708, and the opaque layer 704 on the left side of the array 700 is used to connect to the electrode gate 608 via a metal contact 710. Since the signals to gates 606 and 608 are applied by different clocks, a gap 712 between the various layers 704 prevents shorting therebetween. The gap 712 is covered by another opaque layer 706 (which typically includes or consists essentially of a metal such as tungsten or aluminum) to prevent light from entering the array 700.

Figure 13:
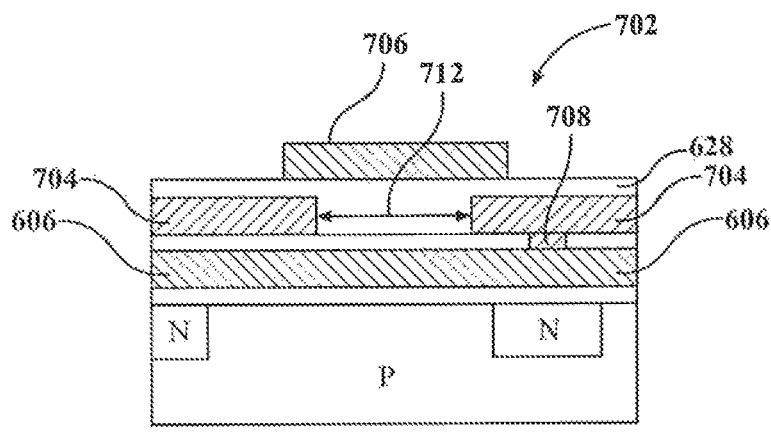
FIG. 13 is a partial cross-sectional view of the array of FIG. 12.

FIG. 13 depicts a cross-sectional view of a portion of the array shown in FIG. 12 along the line D-D'. The pixel 702 is similar to pixel 602 except that the two opaque layers 704, 706 collectively cover the entire pixel 702. The opaque layer 704 on the right side of the array is used to connect to the electrode gate 606 metal contact 708. The gap 712 is covered by the opaque layer 706 to block incoming light.

As detailed above, embodiments of the present invention incorporate dark pixels that omit the PSR present in active pixels. The omission of the PSR not only minimizes or eliminates PSR-related dark currents in the dark pixels, but also presents other advantages. For example, the electrode control gates utilized to control charge transfer within the vertical channel (i.e., the VCCD) may be formed as straight stripes without changes in width or turns therein that are typically required to route the electrode gates around the perimeter of the PSR region (and thus not block incoming light). Thus, the electrode gates may be formed with a lower-resolution lithography tool, improving yield due to the simple topography of the electrode gates (i.e., long stripes). In addition, using a lower-resolution, large field-of-view lithography tool eliminates the need to "stitch" together portions of the gates via multiple different exposures in a higher-resolution tool, which results in many benefits such as reducing manufacturing cost due to fewer process steps, improving yield, and eliminating stitching seam artifacts. Furthermore, as mentioned above, the vertical channel (e.g., vertical channel 612) may be formed with a larger width since the PSR is not present within the pixel, thus improving charge-transfer efficiency. Relatedly, and as also mentioned above, the width of the vertical channel may be kept constant, pixel-to-pixel, even as the overall pixel widths are reduced within a fanned region of dark pixels, thus maintaining the charge capacity of the vertical channel and improving charge-transfer efficiency.

Embodiments of the present invention may be utilized in a variety of different systems and devices, including, for example, digital cameras, digital video cameras, scanners, and telescopes. FIG. 14 illustrates an exemplary image capture device 1400 in accordance with an embodiment of the invention. Image capture device 1400 is implemented as a digital camera in FIG. 14.

Light 1402 from a subject scene to be imaged is input to an imaging stage 1404, where the light is focused by a lens 1406 to form an image on a CCD image sensor 1408 (which may incorporate fanned and/or slanted dark-pixel regions and/or the dark pixel structures described above). Image sensor 1408 converts the incident light to an electrical signal for each pixel thereof. The pixels of image sensor 1408 may have a color filter array (e.g., a Bayer filter, not shown) applied thereover so that each pixel senses a portion of the imaging spectrum.

The light passes through the lens 1406 and a filter 1410 prior to being sensed by image sensor 1408. Optionally, light 1402 passes through a controllable iris 1412 and a mechanical shutter 1414. The filter 1410 may include or consist essentially of an optional neutral-density filter for imaging brightly lit scenes. An exposure controller 1416 responds to the amount of light available in the scene, as metered by a brightness sensor block 1418, and regulates the operation of filter 1410, iris 1412, shutter 1414, and the integration time (or exposure time) of image sensor 1408 to control the brightness of the image as sensed by image sensor 1408.

This description of a particular camera configuration will be familiar to those skilled in the art, and it will be obvious that many variations and additional features are, or may be, present. For example, an autofocus system may be added, or the lenses may be detachable and interchangeable. It will be understood that embodiments of the present invention may be applied to any type of digital camera, where similar functionality is provided by alternative components. For example, the digital camera may be a relatively simple point-and-shoot digital camera, where shutter 1414 is a relatively simple movable blade shutter, or the like, instead of a more complicated focal plane arrangement as may be found in a digital single-lens reflex camera. Embodiments of the invention may also be incorporated within imaging components included in simple camera devices such as those found in, e.g., mobile phones and automotive vehicles, which may be operated without controllable irises 1412 and/or mechanical shutters 1414. Lens 1406 may be a fixed focal-length lens or a zoom lens.

As shown, the analog signal from image sensor 1408 (corresponding to the amount of charge collected from one or more pixels) is processed by analog signal processor 1420 and applied to one or more analog-to-digital (A/D) converters 1422. A timing generator 1424 produces various clocking signals to select rows, columns, or pixels in image sensor 1408, to transfer charge out of image sensor 1408, and to synchronize the operations of analog signal processor 1420 and A/D converter 1422. An image sensor stage 1426 (all or parts of which may correspond to CCD image sensor 100 as depicted in FIG. 1B, image sensor 200 as depicted in FIG. 3, image sensor 250 as depicted in FIG. 4, or image sensor 300 as depicted in FIG. 5) may include image sensor 1408, analog signal processor 1420, analog-to-digital (A/D) converter 1422, and timing generator 1424. The resulting stream of digital pixel values from A/D converter 1422 is stored in a memory 1428 associated with a digital signal processor (DSP) 1430.

DSP 1430 is one of three processors or controllers in the illustrated embodiment, which also includes a system controller 1432 and exposure controller 1416. Although this partitioning of camera functional control among multiple controllers and processors is typical, these controllers or processors are combined in various ways without affecting the functional operation of the camera and the application of embodiments of the present invention. These controllers or processors may include or consist essentially of one or more DSP devices, microcontrollers, programmable logic devices, or other digital logic circuits. Although a combination of such controllers or processors has been described, it should be apparent that one controller or processor may be designated to perform all of the required functions. All of these variations may perform the same function and fall within the scope of various embodiments of the invention, and the term "processing stage" is utilized herein to encompass all of this functionality within one phrase, for example, as in processing stage 1434 in FIG. 14.

In the illustrated embodiment, DSP 1430 manipulates the digital image data in memory 1428 according to a software program stored in a program memory 1436 and copied to memory 1428 for execution during image capture. DSP 1430 executes the software necessary for image processing in an embodiment of the invention. Memory 1428 may include or consist essentially of any type of random access memory, such as SDRAM. A bus 1438, a pathway for address and data signals, connects DSP 1430 to its related memory 1428, A/D converter 1422, and other related devices.

System controller 1432 controls the overall operation of the image capture device 1400 based on a software program stored in program memory 1436, which may include or consist essentially of, e.g., flash EEPROM or other nonvolatile memory. This memory may also be used to store image sensor calibration data, user setting selections, and/or other data to be preserved when the image capture device 1400 is powered down. System controller 1432 controls the sequence of image capture by directing exposure controller 1416 to operate lens 1406, filter 1410, iris 1412, and shutter 1414 as previously described, directing timing generator 1424 to operate image sensor 1408 and associated elements, and directing DSP 1430 to process the captured image data. After an image is captured and processed, the final image file stored in memory 1428 may be transferred to a host computer via an interface 1440, stored on a removable memory card 1442 or other storage device, and/or displayed for the user on an image display 1444.

A bus 1446 includes a pathway for address, data and control signals, and connects system controller 1432 to DSP 1430, program memory 1436, a system memory 1448, host interface 1440, memory card interface 1450, and/or other related devices. Host interface 1440 provides a high-speed connection to a personal computer or other host computer for transfer of image data for display, storage, manipulation, and/or printing. This interface may include or consist essentially of an IEEE 1394 or USB 2.0 serial interface or any other suitable digital interface. Memory card 1442 is typically a Compact Flash card inserted into a socket 1452 and connected to system controller 1432 via memory card interface 1450. Other types of storage that may be utilized include, without limitation, PC-Cards, MultiMedia Cards, and/or Secure Digital cards.

Processed images may be copied to a display buffer in system memory 1448 and continuously read out via a video encoder 1454 to produce a video signal. This signal may be output directly from image capture device 1400 for display on an external monitor, or processed by a display controller 1456 and presented on image display 1444. This display is typically an active-matrix color liquid crystal display, although other types of displays may be utilized.

A user interface 1458, including all or any combination of a viewfinder display 1460, an exposure display 1462, a status display 1464, image display 1444, and user inputs 1466, may be controlled by one or more software programs executed on exposure controller 1416 and system controller 1432. User inputs 1466 typically include some combination of buttons, rocker switches, joysticks, rotary dials, and/or touch screens. Exposure controller 1416 operates light metering, exposure mode, autofocus and other exposure functions. System controller 1432 manages the graphical user interface (GUI) presented on one or more of the displays, e.g., on image display 1444. The GUI typically includes menus for making various option selections and review modes for examining captured images.

Exposure controller 1416 may accept user inputs selecting exposure mode, lens aperture, exposure time (shutter speed), and exposure index or ISO speed rating and directs the lens and shutter accordingly for subsequent captures. Optional brightness sensor 1418 may be employed to measure the brightness of the scene and provide an exposure meter function for the user to refer to when manually setting the ISO speed rating, aperture, and shutter speed. In this case, as the user changes one or more settings, the light meter indicator presented on viewfinder display 1460 tells the user to what degree the image will be over- or under-exposed. In an alternate case, brightness information is obtained from images captured in a preview stream for display on image display 1444. In an automatic exposure mode, the user changes one setting and exposure controller 1416 automatically alters another setting to maintain correct exposure, e.g., for a given ISO speed rating when the user reduces the lens aperture, exposure controller 1416 automatically increases the exposure time to maintain the same overall exposure.

The foregoing description of an image capture device will be familiar to one skilled in the art. It will be obvious that there are many variations that are possible and may be selected to reduce the cost, add features, or improve the performance thereof.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An image sensor comprising:
   two or more pixel sub-arrays each comprising at least one output structure for conversion of charge to voltage, at least one of the sub-arrays comprising:
   a region of active pixels each comprising (i) a photosensitive region (PSR) for converting light into electrical charge and (ii) a vertical channel for transfer of charge from the PSR,
   electrically and directly connected to and positioned below the region of active pixels, a fanned region of dark pixels each (i) comprising a vertical channel for transferring charge and (ii) shielded from incident light,
   electrically and directly connected to and positioned below the fanned region of dark pixels, an unfanned region of dark pixels each (i) comprising a vertical channel for transferring charge and (ii) shielded from incident light,
   electrically and directly connected to and positioned below the unfanned region of dark pixels, a horizontal CCD (HCCD), and
   electrically connected to the HCCD, an output structure for conversion of charge to voltage,
   wherein (i) a width of the dark pixels in the fanned region decreases along a direction extending from the array of active pixels to the unfanned region, and (ii) a width of the dark pixels in the unfanned region is substantially constant along a direction extending from the fanned region to the HCCD.

2. The image sensor of claim 1, wherein one or more dark pixels in the fanned region comprises a PSR.

3. The image sensor of claim 1, wherein one or more dark pixels in the unfanned region comprises a PSR.

4. The image sensor of claim 1, wherein a width of the vertical channel within dark pixels of the fanned region is substantially equal to a width of the vertical channel within dark pixels of the unfanned region.

5. The image sensor of claim 1, wherein one or more dark pixels in the fanned region lack a PSR.

6. The image sensor of claim 1, wherein one or more dark pixels in the unfanned region lack a PSR.

7. The image sensor of claim 1, wherein one or more of the sub-arrays comprises:

a region of active pixels each comprising (i) a PSR and (ii) a vertical channel for transferring charge from the PSR;

electrically connected to the region of active pixels, an unfanned region of dark pixels each (i) comprising a vertical channel for transferring charge and (ii) shielded from incident light;

electrically connected to the unfanned region of dark pixels, an HCCD; and electrically connected to the HCCD, an output structure for conversion of charge to voltage, wherein a width of the dark pixels in the unfanned region is substantially equal to a width of the active pixels in the region of active pixels.

8. The image sensor of claim 1, wherein the output structure of one sub-array is disposed within a gap between two sub-arrays resulting from a pixel-width decrease within a fanned region of dark pixels within at least one of the two sub-arrays.

9. The image sensor of claim 1, wherein the output structures of two adjoining sub-arrays are both disposed within a gap between the two sub-arrays resulting from a pixel-width decrease within a fanned region of dark pixels within at least one of the two sub-arrays.

10. The image sensor of claim 1, wherein the output structure of at least one of the sub-arrays comprises (i) a dummy shift register having a width substantially equal to a width of shift registers in the HCCD, (ii) a charge-carrying region having a width, along at least a portion of its length, smaller than the width of shift registers in the HCCD, (iii) a sense node, and (iv) an amplifier for conversion of charge into a voltage signal.

11. The image sensor of claim 10, wherein the charge-carrying region comprises a tapered region having a width that decreases along at least a portion of its length.

12. The image sensor of claim 1, further comprising a plurality of control gate electrodes extending across fanned regions of dark pixels of at least two sub-arrays.

13. The image sensor of claim 1, wherein a direction of charge transfer in the vertical channels of the active pixels is (i) substantially parallel to a direction of charge transfer in the vertical channels of the dark pixels of the unfanned region and (ii) substantially perpendicular to a direction of charge transfer in the HCCD.

14. The image sensor of claim 1, wherein the HCCD comprises a plurality of shift registers having substantially equal dimensions in a direction of charge transfer within the HCCD.

* * * * *